United States Patent [19]

Schmitt et al.

[11] Patent Number: 4,684,594

[45] Date of Patent: Aug. 4, 1987

[54] ELECTROPHOTOGRAPHIC PROCESS FOR PREPARING PRINTING FORMS USING ALKALINE DECOATER SOLUTION

[75] Inventors: Klaus Schmitt; Klaus-Peter Schoen, both of Wiesbaden; Peter Riedel, Huenfelden; Juergen Lingnau, Mainz-Laubenheim; Engelbert Pliefke, Wiesbaden, all of Fed. Rep. of Germany

[73] Assignee: Hoechst Aktiengesellschaft, Frankfurt am Main, Fed. Rep. of Germany

[21] Appl. No.: 905,236

[22] Filed: Sep. 9, 1986

[30] Foreign Application Priority Data

Sep. 11, 1985 [DE] Fed. Rep. of Germany ....... 3532346

[51] Int. Cl.⁴ ............................................. G03G 13/26
[52] U.S. Cl. ....................................... 430/49; 430/314
[58] Field of Search ......................................... 430/49

[56] References Cited

U.S. PATENT DOCUMENTS 3,753,760 8/1973 Kosel .................................... 430/114
4,548,885 10/1985 Brechlin ............................... 430/49

FOREIGN PATENT DOCUMENTS 2504130 8/1975 Fed. Rep. of Germany .
853586 5/1985 South Africa .
944126 12/1963 United Kingdom .
1465926 3/1977 United Kingdom .

Primary Examiner—J. David Welsh
Attorney, Agent, or Firm—Schwartz, Jeffery, Schwaab, Mack, Blumenthal & Evans

[57] ABSTRACT

Printing forms or metallized images can be prepared electrophotographically by a process comprising the electrostatic chargeup, imagewise exposure and tonering of a photoconductor layer applied to an electroconductive base material, followed by fixing of the tonered image areas, removal of the photoconductive layer in the non-image areas by decoating and, where appropriate, etching of the bared base material surface. A recording material is used that comprises a photoconductive layer containing at least one organic n-conducting pigment in a concentration between 10 and 50 percent by weight and an organic p-conducting photoconductor in a concentration of 0 to 20 percent by weight, based on the layer weight, together with a binder which is soluble or dispersible in aqueous-alkaline solution. The decoating is carried out with an aqueous-alkaline decoater solution, which preferably contains alkali metal hydroxides and/or phosphates. The decoating is preferably carried out at an elevated temperature, for example, between about 30° to 60° C.

13 Claims, No Drawings

ELECTROPHOTOGRAPHIC PROCESS FOR PREPARING PRINTING FORMS USING ALKALINE DECOATER SOLUTION

BACKGROUND OF THE INVENTION

The present invention relates to a process for preparing printing forms or metallized images by electrophotographic means through electrostatic chargeup, imagewise exposure and tonering of a photoconductor layer applied to an electroconductive base material; fixing the tonered image areas; removing the photoconductor layer in the nonimage areas by decoating and, where appropriate, etching the bared base material surface.

Processes for preparing printing forms, such as offset printing plates, and printed circuits by electrophotographic means are known. For instance, offset printing plates with a photoconductor layer which contains zinc oxide can be prepared by subjecting the plate, which is imagewise covered with toner after development, to controlled hydrophilization with a hydrophilizing agent, for example, by treatment with ferricyanide solution, in the nonimage areas. As a result, differentiation is obtained between ink-accepting, hydrophobic, tonered image areas and the hydrophilized layer surface. The disadvantage of such a process is the necessity of having to repeat the hydrophilizing step more than once, and the relatively short print run.

To overcome the disadvantages described, there has been a trend, in the field of electrophotographically presensitized offset printing plates, toward systems where the hydrophilizing step is replaced by a decorating step. It is thus possible, according to German Auslegeschrift No. 1,117,391 (corresponding to British Pat. No. 944,126), to obtain image differentiation by using as the binder of the photoconductive layer a high molecular weight compound that contains alkali-solubilizing groups. Tonering and fixing the tonered image areas yields a mask which restricts decorating with an alkaline decoater to the nonimage areas of the photoconductor layer. By using a hydrophilic base material, such as an electrochemically or mechanically roughened and anodized aluminum base, it is thus possible to obtain differentiation between hydrophobic toner image or hydrophobic photoconductor layer, on the one hand, and the bared hydrophilic base material surface, on the other hand.

For decorating, solutions of inorganic and/or organic alkaline substances in water and/or organic solvents are used. Sparingly volatile amines or amino alcohols, which are used in concentrations between about 1 and 5% as solution in polyhydric alcohols and/or water, are considered particularly suitable. Application can be effected not only by simply wiping, for example, with an impregnated pad of absorbent cotton, or by dipping into a decorating bath, but also by means of appropriate mechanized apparatus in which the alkaline liquid is applied.

It is known (German Auslegeschrift No. 1,117,391 and German Pat. No. 2,322,046, corresponding to British Pat. No. 1,465,926) that good decoating action is obtained in particular when the decoater contains solvents, especially alcohols. Such solvents are capable of dissolving the organic photoconductor which is dissolved in the binder matrix of the mentioned layers, thereby speeding up the decoating step. This is of particular importance for mechanized processing, where the required decorating rate and service life of decorator are high. Solvent-containing decoaters also offer advantages with regard to machine soiling, since, by virtue of their dissolving power vis-a-vis the photoconductor, they prevent undesirable photoconductor deposits in the apparatus. Solvent-free decoater compositions cannot be used for this purpose.

On the other hand, solvent-containing decoaters have a number of disadvantages. For instance, when amines are used it is generally not possible to avoid a certain odor nuisance. For safety reasons, furthermore, the choice of solvents which can be used is restricted with respect to flash point or, alternatively, it is necessary to take expensive safety precautions. Finally, the toner of the developer—in general, polymers without alkali-solubilizing groups—frequently exhibits a certain solubility or swellability in the solvents used. This is true in particular of liquid developers of the dispersimer type as known, for example, from German Auslegeschrift No. 2,114,773, corresponding to U.S. Pat. No. 3,753,760. Solubility or swellability of the fixed toner during the decoating step results in considerable losses, particularly in the case of fine image elements. The decoater, passing through the toner mask, also attacks the photoconductor layer underneath; this can give rise to etching underneath the mask and to the subsequent float-off of the toner mask. This is also true of toner masks from dry developers, although—owing to the different manufacturing process—to a reduced degree.

The switch in preparing printing forms to photoconductive layers that contain small amounts of photoconductor dissolved in the binder and, in addition, very high amounts of photoconductive organic pigments, as described in German Offenlegungsschrift 34 17 951 leads (in the case of using solvent-containing photoconductor layers) to undesirable, significantly slower decoating speeds which are no longer sufficient for practical use. Complete decoating cannot be guaranteed in these cases.

SUMMARY OF THE INVENTION

It is therefore an object of the present invention to provide for the processing of printing forms and metallized images using recording materials that have photoconductive layers containing a high proportion of organic pigment and a low amount of organic photoconductors dissolved in a binder.

It is also an object of the present invention to provide an electrophotographic imaging process that permits efficient differentiation between tonered and nontonered areas, regardless of whether a liquid or dry developer is used, and that accommodates, with respect to service life and decoating speed, implementation in a mechanized processing system.

In accomplishing the foregoing objects, there has been provided, in accordance with one aspect of the present invention, an electrophotographic process for preparing printing forms or metallized images using recording material comprised of an electroconductive base material and a photoconductor layer provided on the base material, comprising the steps of (A) subjecting the recording material to electrostatic chargeup;

(B) imagewise exposing and tonering of the photoconductive layer to produce tonered image areas thereon;

(C) fixing the toner image areas on the photoconductive layer; and thereafter (D) treating the photoconductive layer with an aqueous-alkaline decoater solution such that nonimage areas of the photoconductive layer are removed and portions of the base material are exposed, wherein the photoconductor layer contains (i) at least one organic, n-conducting pigment in a concentration between about 10 and 50 percent by weight, based on total weight of the photoconductor layer; (ii) an organic, p-conducting photoconductor in a concentration of from 0 to 20 percent by weight, based on total weight of the photoconductor layer; and (iii) an amount of a binder that is soluble or dispersible in aqueous-alkaline solution, the amount being sufficient to stabilize the photoconductor layer structurally. In one preferred embodiment, the decoater solution contains an alkali metal hydroxide and/or phosphate, preferably in a concentration between of about 0.01 and 10 percent by weight. In another preferred embodiment, the decoating solution is substantially free of organic solvents. In further preferred embodiment, step (D) is carried out at an elevated temperature.

With the present invention, electrophotographic recording materials comprising a photoconductor layer as described above are rendered usable for producing printing forms and metallized images which conform to industrially high standards. The decoating solutions of the present invention possess a high decoating speed and a satisfactory service life. Surprisingly, decoating solutions used according to the present invention reproduce particularly fine image elements, and sub-mask etching is avoided.

DETAILED DESCRIPTION OF THE PREFERRED EMBODIMENTS

Recording materials which can be used according to the present invention have a relatively high content of photoconductive organic pigments, which are embedded in binders that are soluble or dispersible in aqueous alkaline solution. To increase electrophotographic sensitivity, such photoconductor layers can also contain small amounts of an organic p-conductor. For instance, the materials described in German Offenlegungsschrift 34 17 951 as comprising photoconductive organic pigment and a carbonyl-containing binder can be used when the binder is rendered soluble or dispersible in aqueous alkaline solution by incorporation of carboxylic acid or carboxylic acid anhydride groups. Preferred binders in this regard are copolymers of methacrylic acid esters, methacrylic acid and, where appropriate, with other monomers, such as styrene. In addition to the known binders with carbonyl functional groups, the process of the present invention can be used to process even those layers that comprise binders having, for example, sulfonic acid, phosphonic acid, carbonic acid and similar, alkalisolubilizing varieties.

Aqueous alkaline decoater solutions that are used in accordance with the present invention are aqueous solutions of inorganic substances. Suitable inorganic alkaline substances are ammonia, alkali metal and alkaline earth metal hydroxides, alkali metal and alkaline earth metal phosphates, hydrogenphosphates, carbonates, silicates, borates and the like. It is preferable to use alkali metal hydroxides and phosphates. These inorganic substances are used in aqueous solution in concentrations between about 0.01 and 10 percent by weight, preferably between 1 and 5 percent by weight. The decoater solution can include organic solvents in small amounts without changing the desirable properties of the developer. In a preferred embodiment, organic solvents are dispensed with entirely.

To increase the rate of decoating and to minimize soiling of the decoating apparatus, it has been found to be advantageous, in the context of the present invention, to add suitable dispersants to the decoater solution. Suitable for use as dispersants in this regard are all anionic, cationic and nonionic surfactants generally suitable for aqueous systems. Exemplary dispersants of this sort are alkylsulfonates, alkyl phosphonates, alkali metal salts of fatty alcohol hemiesters of sulfuric acid, fatty amine derivatives, oligomers of ethylene oxide with suitable end groups, such as nonylphenol, and siloxanes. Surfactants that are particularly suitable for increasing the decoating rate, and for stabilizing the pigment thus removed in the resulting decoater dispersion, are the alkali metal alkylsulfates, such as sodium octylsulfate. The dispersants are added to the decoater solution in concentrations between about 0.1 and 5 percent by weight. Particularly good results are obtained with concentrations between about 0.5 and 3 percent by weight.

In the preparation of offset printing plates on anodized base material, it has been found to be advantageous to add substances that protect the anodized aluminum-/aluminum oxide surface from attack by the decoater solution. Illustrative of such substances are silicate compounds.

To increase the service life of the decoater and the constancy of decoating conditions, particularly in the case of mechanized decoating, it has been discovered that it is advantageous to keep the pH of the decoater solution substantially constant either by adding a buffer, such as a phosphate buffer or one of the other buffer systems described in the literature, or by topping up with a concentrate of higher pH.

The decoating can be carried out at room temperature, but it can also be carried out at elevated temperature. The decoating is preferably carried out within the range from 30° C. to 60° C.

The development at elevated temperature of light-sensitive planographic printing plates which function on a non-electrophotographic basis is well-known. For instance, German Offenlegungsschrift No. 2,504,130, corresponding to Japanese Kokai No. 50-108,005, discloses that, with positive- as well as negative-working systems that distinguish chemically, by photoreaction, between image and nonimage areas, increasing the temperature at which the development is carried out makes possible the processing even of printing plates that have been stored for a prolonged period. The developer solutions used have components that have a boiling point of above 80° C., at atmospheric pressure. The solutions are high in solvent content. Industrial utilization of this process, however, has not been disclosed.

Electrophotographic recording materials, by contrast, generally have considerably higher layer thicknesses for the photoconductor layer than the layers of the above-described light-sensitive systems. Unlike the latter, electrophotographic systems distinguish physically between image and nonimage areas, in that the former are covered up by a toner mask. The photoconductor layer underneath this toner mask is not changed in its chemical composition and, hence, in its behavior toward a decoater solution.

Solvent-containing decoaters cause swelling of the toner as well as of the photoconductor layer nonimage areas that are not protected by a toner mask. The result is also swelling or dissolving of the photoconductor layer image areas underneath the toner mask. This leads to image losses on the printing form or to weak areas in the hydrophobic layer which, in the course of printing, result in image losses on the information carrier.

It has now been found that the attack remains limited to the nonimage areas of the photoconductor layer, and the above-mentioned decoating faults are not observed, when a solvent-free decoater is used, a result that was not readily foreseeable. Surprisingly, this decoating behavior is not even affected by an increase in the temperature. On the contrary, increasing the temperature leads to excellent differentiation between image and nonimage areas, even in the case of liquid toner masks which are more sensitive to decoating. It is generally assumed that due to carbon dioxide absorption from the air with subsequent neutralization, the service life of alkaline decoating solutions is drastically reduced when these are applied at higher temperatures. In contrast to the above even an increase in service life is found in practicing the present invention as long as purely aqueous-alkaline decoaters are used. A check of the respective state of the decoating solution of the present invention can be effected via a relatively simple pH measurement, and topping up is no problem.

A particularly suitable temperature range for decoating the pigment layers, following the present invention, has been found to be in the range between about 30° and 60° C. The lower limit of this range makes it possible to reduce the requisite control outlay for the temperature, compared with mechanized decoating at room temperature. The upper limit is less clearly defined, and is essentially determined by the vapor pressure of the water and any safety measures required for handling the particular hot decoater solutions.

Development of the latent electrostatic image can be effected not only with a dry developer but also in a liquid developer. Developing by tonering with a liquid developer is preferred in the process of the present invention.

To prepare metallized etch images, metallized plastic supports in the form of sheets or plates are used, and the metal layer can be applied by vapor deposition, by laminating and by chemical or galvanic deposition. Decoating is then followed by etching of the bared surface of the base material.

A further advantage of using the process according to the invention is, finally, the relatively simple disposal of the spent decoater solution. By simply neutralizing with acids customary in chemistry, such as hydrochloric acid, or by breaking the dispersion by adding substances that complex with or precipitate the dispersant or that affect its dissociation behavior. For example, by adding milk of lime or sodium chloride in the case of sodium octylsulfate, a large portion of the original layer constituents is precipitated and can be removed by a filtration step. The filter cake obtained can, if desired, be subjected to further processing to isolate the layer components for use again in preparing presensitized offset printing plates.

The present invention is illustrated in more detail by means of the following illustrative examples and comparative examples.

EXAMPLE 1

An electrochemically pretreated and anodised aluminum plate had applied to it the following dispersion in such a way that a dry layer weight of 6 g/m² resulted:

15 g of N,N'-(3-methoxyphenyl)perylenetetracarboxylic acid 3,4,9,10-diimide (Paliogen ® black, BASF AG),
3 g of 4-methoxybenzaldehydediphenylhydrazone, and
42 g of a terpolymer of styrene, hexyl methacrylate and methacrylic acid in a molar ratio of 10:60:30 in
540 g of tetrahydrofuran.

Following an electrostatic chargeup (negative) by means of a corona, the layer was imagewise exposed and was treated with a commercially available dry developer having positively charged toner particles. The toner image was fixed at 150° C. for 5 minutes. Decoating was effected in a commercially available decoating apparatus using the following decoater solutions:

(a)

50 parts by weight of isopropanol,
10 parts by weight of benzyl alcohol,
4 parts by weight of potassium hydroxide,
36 parts by weight of water;

(b)

5.6 parts by weight of potassium hydroxide,
994.4 parts by weight of water;

(c)

5.6 parts by weight of potassium hydroxide,
20 parts by weight of sodium octylsulfate,
974.4 parts by weight of water;

(d)

7.1 parts by weight of disodium phosphate,
2.2 parts by weight of sodium hydroxide,
1529 parts by weight of water; and (e)

2.75 parts by weight of sodium hydroxide,
4 parts by weight of sodium silicate nonahydrate,
3.75 parts by weight of n-butylglycol and
389.5 parts by weight of water.

The rates of decoating listed in the table below were obtained. As a result of the added dispersant in solution (c), a distinctly more stable dispersion of the colored pigment of the decoater solution was obtained; no layer constituent settled out in the decoater stock reservoir vessel. A service life trial without pH readjustment gave for example (c) the most favorable consumption value of 125 ml/m², the temperature being raised from an initial 33° C. to 39° C. at the end of the experimental series in small temperature steps of 1° C. and the rate of decoating being kept constant.

TABLE

| Layer | Decoater solution | Temperature (decoating °C.) | Rate of decoating m/min | Reproduction of highlight | Reproduction of shadow | Removal of background staining |
|---|---|---|---|---|---|---|
| Example 1 | a | 26 | 1.4 | − | − | − |
|  | b | 33 | 1.7 | + | + | + |
|  | c | 33 | 1.7 | ++ | ++ | ++ |
|  | c | 55 | 4.8 | ++ | ++ | ++ |
|  | d | 33 | 1.7 | + | + | + |
|  | e | 26 | 1.7 | + | + | + |
| Comparative | a | 26 | 1.9 | + | + | + |
|  | b | 50 | 0.4 | + | + | + |

TABLE-continued

| Layer | De-coater solution | Temperature (decoating °C.) | Rate of decoating m/min | Reproduction of high-light | Reproduction of shadow | Removal of background staining |
|---|---|---|---|---|---|---|
| Example 1 | c | 50 | 0.9 | + | + | + |

− weak
+ good
++ very good

COMPARATIVE EXAMPLE 1

Example 1 was repeated, except that the pigment plate was replaced by a plate which, on an appropriately pretreated aluminum base material, carried a 6 g/m²-thick layer consisting of 50 parts by weight of a copolymer of maleic acid hemiester and styrene (Scripset ® 540, Monsanto), 50 parts by weight of a photoconductor bis(N,N-diethylaminophenyl)-1,3,4-oxadiazole, and 0.5 part by weight of Rhodamin B.

Although decoating with decoater variants (b) and (c) proved possible at distinctly increased temperatures, compared with Example 1, redeposition of layer constituents on the transport rolls of the decoating apparatus did occur.

EXAMPLE 2

Example 1 was repeated, except that the dry developer was replaced by a dispersimer-based liquid developer as described in German Auslegeschrift No. 2,114,773.

Under decoating conditions unchanged compared with Example 1, use of solvent-containing decoater solution (a) gave distinct losses at the highlights of halftone fields. Although increasing the rate of decoating resulted in an improvement in this regard, it was not enough to give complete decoating in nonimage areas and shadows. The decoater variants (b) and (c), by contrast, gave image reproductions free from background staining, with excellent reproduction not only of the shadows but also of the highlights.

COMPARATIVE EXAMPLE 2

Example 1 was repeated, except that the decoater solution used comprised
180 parts of 2-propanol,
20 parts by weight of benzyl alcohol,
2.5 parts by weight of monoethanolamine and
3 parts by weight of sodium octylsulfate.

This decoater solution corresponded in composition to the decoater solution listed in Example 1 of German Offenlegungsschrift No. 2,504,130 for chemically differentiating diazo layers, and led to good results in that context. But when it was used as a decoater solution for highly pigmented electrophotographic layers, the toner image, prepared by dry as well as by liquid developer, was massively attacked. Fine image elements were lost during the decoating process.

What is claimed is:

1. An electrophotographic process for preparing printing forms or metallized images using recording material comprised of an electroconductive base material and a photoconductor layer provided on said base material, comprising the steps of
   (A) subjecting said recording material to electrostatic chargeup;
   (B) imagewise exposing and tonering of said photoconductive layer to produce tonered image areas thereon;
   (C) fixing said toner image areas on said photoconductive layer; and thereafter
   (D) treating said photoconductive layer with an aqueous-alkaline decoater solution such that non-image areas of said photoconductive layer are removed and portions of said base material are exposed, wherein said photoconductor layer contains (i) at least one organic, n-conducting pigment in a concentration between about 10 and 50 percent by weight, based on total weight of said photoconductor layer; (ii) an organic, p-conductor in a concentration of from 0 to 20 percent by weight, based on total weight of said photoconductor layer; and (iii) an amount of a binder that is soluble or dispersible in aqueous-alkaline solution, said amount being sufficient to stabilize said photoconductor layer structurally.

2. An electrophotographic process as claimed in claim 1, further comprising after step (D) the step of etching said portions of said base material.

3. A process as claimed in claim 1, wherein said decoater solution contains at least one compound from the group consisting of an alkali metal hydroxide and an alkali metal phosphate.

4. A process as claimed in claim 3, wherein said decoater solution contains said compound in a concentration of about 0.01 to 10 percent by weight.

5. A process as claimd in claim 1, wherein said decoater solution contains a dispersant.

6. A process as claimed in claim 1, wherein said decoater solution is buffered.

7. A process as claimed in claim 1, wherein step (D) is carried out at an elevated temperature.

8. A process as claimed in claim 7, wherein step (D) is carried out at a temperature within the range from about 30° C. to 60° C.

9. A process as claimed in claim 1, wherein said decoater solution contains a silicate.

10. A process as claimed in claim 1, wherein said binder in said photoconductive layer comprises a copolymer comprised of a methacrylic acid ester and methacrylic acid.

11. A process as claimed in claim 10, wherein said copolymer further comprises styrene.

12. A process as claimed in claim 1, wherein said tonering of said photoconductive layer is effected with a liquid developer.

13. A process as claimed in claim 1, wherein said decoater solution is substantially free of organic solvents.

* * * * *